United States Patent [19]

Nakano et al.

[11] 4,350,536
[45] Sep. 21, 1982

[54] METHOD OF PRODUCING DYNAMIC RANDOM-ACCESS MEMORY CELLS

[75] Inventors: Motoo Nakano, Yokohama; Tsutomu Ogawa, Tokyo, both of Japan

[73] Assignee: Fujitsu Limited, Kawasaki, Japan

[21] Appl. No.: 180,947

[22] Filed: Aug. 25, 1980

[30] Foreign Application Priority Data

Aug. 30, 1979 [JP] Japan .................. 54-110718

[51] Int. Cl.³ .............. H01L 21/02; H01L 21/18; H01L 21/22; H01L 21/265
[52] U.S. Cl. ........................ 148/1.5; 29/571; 29/578; 148/187; 148/188; 148/190; 357/23; 357/41
[58] Field of Search ............ 148/190, 187, 188, 1.5; 29/571, 578; 357/23, 24, 41, 51

[56] References Cited

U.S. PATENT DOCUMENTS

| | | | |
|---|---|---|---|
| 3,753,807 | 8/1973 | Hoare et al. | 148/1.5 |
| 3,832,247 | 8/1974 | Saddler et al. | 148/188 |
| 4,063,967 | 12/1977 | Graul et al. | 148/188 |
| 4,112,575 | 9/1978 | Fu et al. | 148/187 |
| 4,164,751 | 8/1979 | Tasch, Jr. | 148/187 |
| 4,190,466 | 2/1980 | Bhattacharyya et al. | 148/187 |
| 4,282,646 | 8/1981 | Fortino et al. | 148/1.5 |

OTHER PUBLICATIONS

Sodini, C. G. et al., Enhanced Capacitor for One-Transistor Memory Cell. in *IEEE Transactions on Electron Devices*, vol. Ed. 23, pp. 1187-1189, Oct. 1976.
Rideout, V. L. One Device Cells for Dynamic Random-Access Memories: A Tutorial, in *IEEE Transactions on Electron Devices*, vol. Ed 26, No. 6, pp. 839-852, Jun. 1979.
Fredericks, E. C., Polysulfone Lift-Off Masking Technique, *IBM Technical Disclosure Bulletin*, 20(3), p. 989, Aug. 1977.
Oldham, W. G., The Fabrication of Micro Electronic Circuits, in *Scientific American*, 237(3), pp. 111-128, Sep. 1977.

*Primary Examiner*—L. Dewayne Rutledge
*Assistant Examiner*—Alan E. Schiavelli
*Attorney, Agent, or Firm*—Staas & Halsey

[57] ABSTRACT

The invention is concerned with an improved method of producing a one-transistor cell for a dynamic RAM having a capacitor plate, a transfer gate and a shallow n+-type region and a deeper p+-type region for a junction capacitance. After formation of a thin oxide layer of a dielectric for an MOS capacitance, a patterned photo resist layer is formed. Using the photo resist layer as a mask, n-type impurities are doped into a semiconductor substrate. The capacitor plate and a masking layer are deposited on the photo resist layer and the thin oxide layer. P-type impurities are doped into the capacitor plate. Then, portions of the capacitor plate and masking layer on the photo resist layer are removed by removing the photo resist layer. An end portion of the capacitor plate is removed from under an edge of the remaining masking layer by etching. The p-type impurities are diffused into the silicon substrate by heating to form the deeper p+-type region which does not extend beyond the n+-type region.

18 Claims, 8 Drawing Figures

METHOD OF PRODUCING DYNAMIC RANDOM-ACCESS MEMORY CELLS

BACKGROUND OF THE INVENTION

1. Field of the Invention

The present invention relates to dynamic random-access memories (RAMs), and more particularly to a method of producing one-transistor cells for dynamic RAMs.

2. Description of the Prior Art

There are various well-known structures of one-transistor cells for dynamic random-access memory (RAM) integrated circuits (cf. V. Leo Rideout, "One-Device Cells for Dynamic Random-Access Memories," IEEE Transactions on Electron Devices, Vol. ED-26, No. 6, PP. 839–852, June 1979). A memory cell consists of a transistor (a MOSFET switch) and a charge storage capacitor having an area S. The charge capacitance C of the capacitor consists of an MOS capacitance Co and a junction capacitance Cs and is expressed by means of the following formula.

$$C = CO + Cs$$

It is possible to increase the charge capacitance C by increasing the area S of the charge storage capacitor. However, an increase of the area S involves an increase of the area of the memory cell, so that the cell density is lowered. It is also possible to increase the charge capacitance C by increasing the junction capacitance Cs without increasing the cell area. The junction capacitance Cs is expressed by means of the following formula:

$$Cs = (\epsilon_s \cdot S)/(W)$$

wherein $\epsilon_s$ is the dielectric constant of silicon, assuming a silicon device, and W is the thickness of the depletion layer. Accordingly, an increase of the junction capacitance Cs can be attained by decreasing the thickness W. As illustrated in FIG. 1 the decrease in the depletion layer thickness W is carried out by forming a shallow $n^+$-type region 2 and a deeper $p^+$-type region 3 which lie under a capacitor electrode plate 4 in a p-type silicon substrate 1. The structure of a one-transistor memory cell illustrated in FIG. 1 is almost the same as that of the one-transistor memory cell illustrated in FIG. 15 on page 848 of the above-mentioned reference.

In the one-transistor memory cell of FIG. 1, an MOS capacitance Co is formed by the capacitor electrode plate 4, a thin oxide ($SiO_2$) layer 5 and the $n^+$-type region 2, and a junction capacitance Cs is formed by the $n^+$-type region 2 and the $p^+$-type region 3. The reference numerals 6, 7 and 8 represent a field oxide ($SiO_2$) layer, a first insulating layer (e.g. an $SiO_2$ layer) and a second insulating layer (e.g. a PSG layer), respectively. An $n^+$-type region 9 of a bit line is formed in the silicon substrate 1 and a transfer gate 10 connected to a conductor layer 11 of a word line is formed on the first insulating layer 7. With regard to the structure of the one-transistor memory cell of FIG. 1, it is important that the $n^+$-type region 2 overlaps the $p^+$-type region 3, namely, that an end portion 2a of the $n^+$-type region 2 extend further than an end portion 3a of the $p^+$-type region 3, as illustrated in FIG. 1. The $n^+$-type and $p^+$-type regions 2 and 3 are respectively formed by doping n-type impurities and p-type impurities by ion implantation or thermal diffusion. If the doping steps for the regions 2 and 3 are carried out by using a masking step, as illustrated in FIG. 2, the end portion 3a of the $p^+$-type region 3 covers the end portion 2a of the $n^+$-type region 2, since the diffusion length of p-type impurities is deeper than that of n-type impurities in the silicon substrate 1. Therefore, an inversion layer does not occur easily at a surface portion 3b of the end portion 3a of the $p^+$-type region 3. Namely, a potential barrier occurs at the end portion 3a to prevent a charge from leaving the capacitor C.

The occurring of the potential barrier can be prevented by performing two masking steps for doping of n-type impurities and p-type impurities. Since two masks are used in the two masking steps, it is necessary to provide a margin for aligning one of the masks to a pattern formed by the other mask. Such a margin prevents the cell area from being decreased and the cell density from being increased.

SUMMARY OF THE INVENTION

An object of the present invention is to provide a method of producing a one-transistor cell for a dynamic RAM which method can reduce the number of masking steps necessary for doping n-type impurities and p-type impurities from two to one.

Another object of the present invention is to decrease the area of a one-transistor memory cell and to increase the density of said cell.

In accordance with the present invention the foregoing and other objects are attained by a method of producing a one-transistor cell for a dynamic random-access memory (RAM) having a capacitor plate, a transfer gate, a deep, highly doped region of a first conductivity type and a shallow doped region of a second conductivity type, which method comprises the steps of: forming an oxide layer on a semiconductor substrate of the first conductivity type; forming a patterned photo resist layer on the oxide layer by using a masking step; implanting impurities of the second conductivity type into the substrate; forming a capacitor plate material layer on the oxide layer and photo resist layer; forming a masking layer on the capacitor plate material layer; implanting additional impurities of the first conductivity type into the capacitor plate material layer; removing the patterned photo resist layer together with portions of the capacitor plate material layer and masking layer; removing an end portion of the remaining capacitor plate from under an end portion of the remaining masking layer by etching; removing the masking layer; and diffusing the additional impurities from the capacitor plate, through the oxide layer, and into the semiconductor substrate by heating in an atmosphere containing a predetermined gas to form the deeper highly doped region under the shallow doped region.

DETAILED DESCRIPTION OF THE PREFERRED EMBODIMENTS

Figure 1:
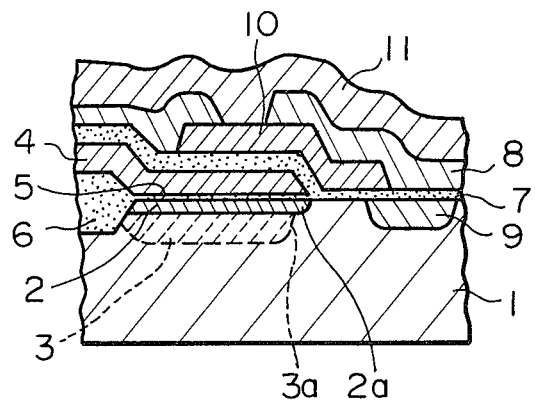
FIG. 1 is a schematic, cross-sectional view of a one-transistor cell for a dynamic RAM.
Figure 2:
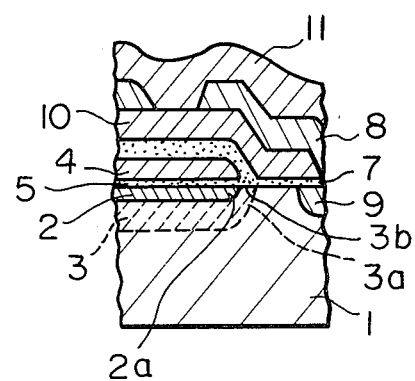
FIG. 2 is a schematic, cross-sectional view of an anomalous one-transistor cell for a dynamic RAM which is produced by using a masking step for doping both n-type impurities and p-type impurities.
Figure 3A:
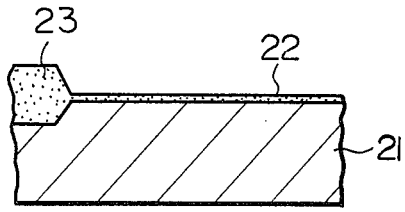
FIGS. 3a through 3f are schematic, cross-sectional views of a one-transistor cell for a dynamic RAM in various stages of its production in accordance with the invention of the present application.

Referring to FIG. 3a, a starting material is a semiconductor substrate 21 being, for example, p$^-$-type single crystalline silicon. A thin oxide layer 22 and a field oxide layer 23 of silicon dioxide (SiO$_2$) are formed on the silicon substrate 21 by a conventional thermal oxidation. The thin oxide layer 22 has a thickness in the range of from 200 through 400 angstroms (A) and serves as a dielectric of a capacitor.

Figure 3B:
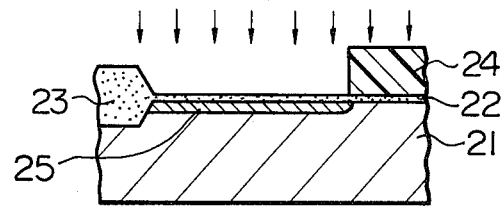

As illustrated in FIG. 3b, a patterned photo resist layer 24 is formed on the oxide layers 22 and 23 by conventional photo-lithography. Namely, a photo resist is applied on the entire surfaces of the oxide layers 22 and 23 by spin-coating to form the photo resist layer 24. The photo resist layer 24 is prebaked, and then, is exposed to ultraviolet rays through a photo mask which has a predetermined pattern and is aligned with a desired location. Then, the photo resist layer is developed by a suitable developer and, after that, postbaked to form the patterned photo resist layer 24. Next, n-type impurities (e.g. arsenic or antimony) are doped into the silicon substrate 21 by ion-implantation to form a shallow n$^+$-type region 25 underlying the thin oxide layer 22. For example, an arsenic ion dose of $1 \times 10^{13}$—$1 \times 10^{14}$ ions/cm$^2$ at an energy of 100-150 KeV may be used.

Figure 3C:
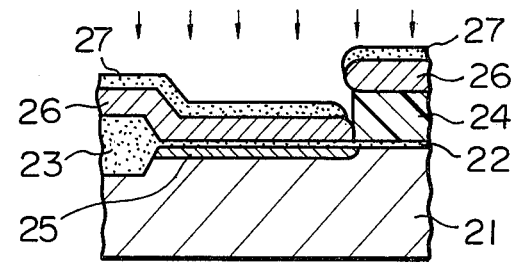

As illustrated in FIG. 3c, a capacitor plate material (e.g. silicon or molybdenum-silicide) is deposited on the patterned photo resist layer 24 and the oxide layers 22 and 23 by vapor deposition or sputtering to form a capacitor plate 26. When the silicon is deposited, the capacitor plate 26 is amorphous silicon. Then, silicon dioxide (SiO$_2$), silicon monoxide (SiO) or aluminum (Al) is deposited on the capacitor plate 26 by vapor deposition or sputtering to form a masking layer 27. It is preferable to carry out the depositions of the capacitor plate 26 and the masking layer 27 successively in a suitable apparatus. Then, p-type impurities (e.g. boron or gallium) are doped into the capacitor plate 26 by ion-implantation. For example, a boron ion dose of $5 \times 10^{14} \sim 5 \times 10^{15}$ ions/cm$^2$ at an energy of 70~150 KeV may be used. In the case where the capacitor plate 26 is amorphous silicon, in order to increase the electric conductivity of the capacitor plate 26, phosphorus ions or arsenic ions can be implanted into the amorphous silicon of the capacitor plate 26 subsequent to the implantation of p-type impurities. It is possible to carry out the implantations of p-type impurities and the phosphorus or arsenic ions prior to the deposition of the masking layer 27.

Figure 3D:
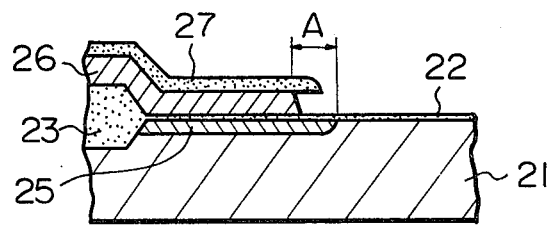

As illustrated in FIG. 3d, the patterned photo resist layer 24 is removed by a suitable remover and simultaneously portions of the capacitor plate 26 and the masking layer 27 on the photo resist layer 24 are removed. Such a removing step is generally referred to as "lift-off". After lift-off, the patterned capacitor plate 26 is still covered with the remaining masking layer 27, but an end surface of the plate 26 is exposed. Then, the exposed end portion of the capacitor plate 26 is etched by a distance A (FIG. 3d) in the range of from 0.5 through 1.5 microns, by using a suitable etchant. Such etching treatment, generally referred to as "undercutting" can be carried out by wet etching or dry etching, preferably by plasma etching.

Figure 3E:
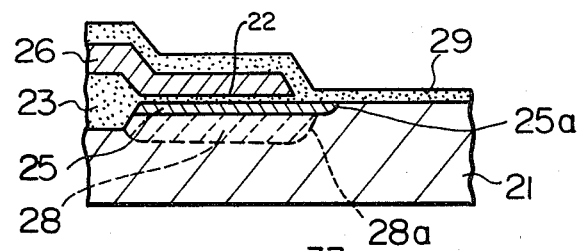

After the etching of the end portion of the capacitor plate 26, the masking layer 27 is removed by a suitable remover. Generally, the remover also removes the exposed thin oxide layer 22. As illustrated in FIG. 3e, the silicon substrate 21 with the oxide layers 22 and 23 and the capacitor plate 26 is heated at a temperature in the range of from 1000° through 1200° C. in an atmosphere containing a predetermined gas, whereby the p-type impurities diffuse into the silicon substrate 21 through the oxide layer 22 out of the capacitor plate 26 to form a deeper p$^+$-type region 28 under the n$^+$-type region 25. In a case where the atmosphere contains hydrogen gas, boron impurities can pass through the silicon dioxide layer 22 easily, since the diffusion rate of boron in an atmosphere containing hydrogen is several hundred times faster than that of boron in an atmosphere containing no hydrogen. Since the diffusion rate of the p-type impurities (e.g. boron) is faster than that of the n-type impurities (e.g. arsenic) in the silicon substrate 21, the p$^+$-type region 28 can be formed. The p-type impurities inevitably diffuse in the horizontal directionm. However, since the end surface of the capacitor plate 26 is located from the end of the n$^+$-type region 25 at the distance A, an end portion 28a of the p$^+$-type region 28 does not extend over an end portion 25a of the n$^+$-type region 25. During the heat treatment the doped phosphorus or arsenic atoms stay in the capacitor plate 26 and do not diffuse out of the capacitor plate 26. Furthermore, the amorphous silicon of the capacitor plate 26 is converted into polysilicon by the above-mentioned heat treatment. When the heat treatment is carried out, it is preferable to add oxygen gas into the atmosphere to form an insulating layer, e.g. an oxide layer 29, as illustrated in FIG. 3e. For example, the silicon substrate 21 and the polysilicon capacitor plate 26 are thermally oxidized to form the insulating layer 29 of silicon dioxide. The formation of the insulating layer 29 may be carried out prior to or subsequent to the heat treatment for diffusion of p-type impurities.

Figure 3F:
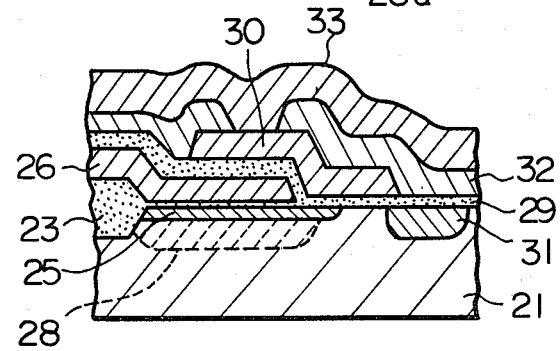

Next, as illustrated in FIG. 3f, a transfer gate 30, an n$^+$-region 31 of a bit line, an insulating layer 32 and a conductor 33 for a word line are formed in sequence to complete a one-transistor memory cell produced in a conventional manner. For example, polysilicon is deposited on the insulating layer 29 and is patterned by photo etching to form the polysilicon transfer gate 30. The n$^+$-type region 31 and source and drain regions of elements (not shown) in peripheral circuits are simultaneously formed by ion-implantation. The insulating layer 32 is made of, for example, PSG and is selectively etched to open a contact hole on the transfer gate 30. Then, a metal for the conductor 33, e.g. aluminum is deposited on the insulating layer 32 by vapor deposition and is patterned by photo etching to form the conductor 33 for a word line.

As can be understood from the above-mentioned explanation, since the lift-off technique and the etching of the end portion of the capacitor plate 26 are utilized, only one masking step using a photo mask is carried out in the doping procedure of n-type impurities and p-type impurities. Therefore, it is possible to make an area of a one-transistor memory cell, produced in accordance with the invention of the present application, which is smaller than that of a one-transistor memory cell produced in accordance with the prior art.

EXAMPLE

A p$^-$-type, (100) oriented silicon wafer 21 was thermal by oxidized to form a silicon dioxide (SiO$_2$) layer 22 of 350 angstroms thickness. The silicon wafer 21 was selectively further oxidized to form a relatively thick field oxide layer 23 of silicon dioxide. A photo resist layer 24 of 1.3 microns thickness was applied on the silicon oxide layers 22 and 23 and was prebaked. The photo resist layer 24 was exposed to ultraviolet rays through a photo mask which was aligned and had a pattern. The photo resist layer 24 was developed, and after that, postbaked to form a patterned photo resist layer 24. Arsenic ions were implanted by using an energy of 120 KeV with an ion dose of $5 \times 10^{13}$ ions/cm$^2$ to form the n$^+$-type region 25 of thickness of 0.1 microns beneath the silicon oxide layer 22. The amorphous silicon capacitor plate 26 having a thickness of 0.4 microns and the silicon dioxide masking layer 27 having a thickness of 0.3 microns were deposited by vapor deposition. Boron ions were implanted into the capacitor plate 26 by using an energy of 100 KeV with an ion dose of $1 \times 10^{15}$ ions/cm$^2$. Then, phosphorus ions were also implanted into the capacitor plate 26 by using an energy of 180 KeV with an ion dose of $4 \times 10^{15}$ ions/cm$^2$. The patterned photo resist layer 24 was removed and simultaneously portions of the capacitor plate 26 and the silicon dioxide masking layer 27 on the photo resist layer 24 were removed.

Using a plasma etching apparatus, the end portion of the capacitor plate 26 under the edge of the silicon dioxide masking layer 27 was etched by a distance of 1.0 microns. The silicon dioxide masking layer 27 was removed and simultaneously the exposed portion of the silicon oxide layer 22 was removed. Then, the obtained silicon wafer 21 with the patterned capacitor plate 26 was heated at a temperature of 1050° C. for 1.0 hour in an atmosphere containing hydrogen gas of 5 vol. % and oxygen gas of 10 vol. %. The boron atoms diffused from the amorphous silicon layer 26 through the silicon oxide layer 22 into the silicon wafer 21 by heating to form a p$^+$-type region 28 which was 0.4 microns thick. The p$^+$-type region 28 did not extend beyond the n$^+$-type region 25 in the horizontal direction. During the heat treatment the exposed portion of the silicon wafer 21 and the capacitor plate 26 were thermally oxidized to form a silicon oxide (SiO$_2$) insulating layer 29 of 500 angstroms thickness on the silicon wafer 21 and 1200 angstroms thickness on the capacitor plate 21, and simultaneously the amorphous silicon of the capacitor plate 26 was converted into polysilicon.

In accordance with a conventional production manner, polysilicon was deposited on the silicon oxide 29 and etched by photo etching to form the transfer gate 30 of polysilicon. The n$^+$-type region 31 of a bit line was formed by ion-implantation. PSG was applied on the transfer gate 30 and the silicon oxide layer 29 to form the insulating layer 32 and then was selectively etched to open a contact hole for connecting the transfer gate 30 to a word line. Finally aluminum was deposited and selectively etched to form the conductor 33 for the word line. Thus, a one-transistor cell for dynamic random-access memory (RAM) integrated circuits was completed.

We claim:

1. A method of producing a dynamic random-access memory cell having a capacitor plate and a transfer gate positioned on a semiconductor substrate of a first conductivity type, a shallow doped region of the opposite conductivity type formed in said substrate to extend under said capacitor plate, and a deeper highly doped region of the first conductivity type formed under said shallow doped region without any portion of said deeper region extending beyond said shallow region from said capacitor plate toward said transfer gate, to avoid the formation of a barrier region between said capacitor plate and said transfer gate, said method comprising the steps of:

forming an oxide layer on said semiconductor substrate;
forming a patterned photo resist layer on said oxide layer;
selectively implanting impurities of said opposite conductivity type into said substrate to form said shallow doped region using said patterned photo resist layer as a mask;
forming a layer of material for said capacitor plate on said oxide layer and said patterned photo resist layer;
in selective order forming a masking layer on said capacitor plate material layer and implanting impurities of the first conductivity type into said capacitor plate material layer, the diffusion rate of said impurities of said first conductivity type in said semiconductor substrate being faster than that of said impurities of the opposite conductivity type,
removing said patterned photo resist layer together with the portions of said masking layer and said capacitor plate material layer formed on said photo resist layer to leave said capacitor plate, and a portion of said masking layer on said capacitor plate,
removing an end portion of said capacitor plate from under an end portion of the remaining masking layer overlaying said capacitor plate by etching;
removing the remaining masking layer remaining on said capacitor plate; and
diffusing said impurities of the first conductivity type from said capacitor plate through said oxide layer and into said semiconductor substrate under said shallow doped region by heating said substrate in an atmosphere containing a predetermined gas to form said deeper highly doped region under said shallow doped region, said removed end portion being such as to prevent said formation of said barrier region as a result of said shallower region extending beyond said deeper region toward said transfer gate.

2. The method according to claim 1, wherein said semiconductor substrate is a single crystalline silicon wafer, and said oxide layer is a silicon dioxide layer having a thickness in the range of from 200 through 400 angstroms formed by thermal oxidation of said semiconductor substrate.

3. The method according to claim 1 or 2, wherein said step of forming the patterned photo resist layer comprises:

applying a photo resist on said oxide layer to form a photo resist layer;
exposing said photo resist layer through a photo mask having a pattern; and
developing said photo resist layer to form said patterned photo resist layer.

4. The method according to claim 1, wherein said first conductivity type is p-type.

5. The method according to claim 1 or 2, wherein said opposite conductivity type impurities are arsenic or antimony.

6. The method according to claim 1 or 2, wherein said first conductivity type impurities are boron or gallium.

7. A method according to claim 1, wherein said material for the capacitor plate is one selected from the group consisting of amorphous silicon and molybdenum-silicide.

8. A method according to claim 7, wherein said amorphous silicon is converted into polysilicon by heating in said diffusing step.

9. The method according to claim 7, wherein said capacitor plate comprises amorphous silicon, and said method further comprises a step of implanting phosphorus ions or arsenic ions into said capacitor plate material subsequent to said step of implanting said first conductivity type impurities.

10. A method according to claim 2 or 4, wherein said end portion of said capacitor plate is removed by an amount in the range of from 0.5 through 1.5 microns.

11. The method according to claim 1, 2 or 4, wherein said step of diffusing said impurity of said first conductivity type is performed at a temperature in the range of from 1000° to 1200° C. in an atmosphere containing hydrogen gas.

12. The method of claim 1 or 4, wherein either of said steps of implanting impurities utilizes ion-implantation.

13. The method of claims 1, 2, 4 or 7 wherein said capacitor plate comprises amorphous silicon and said method further comprises a step of selectively implanting phosphorus ions and arsenic ions into said capacitor plate material prior to said step of forming a masking layer on said capacitor plate.

14. The method of claim 1, 2, 4 or 7 further including the step of thermally oxidizing the semiconductor substrate and the capacitor plate to form an insulating layer covering said semiconductor substrate and said capacitor plate.

15. The method of claim 14, wherein said oxidizing step is carried out prior to the step of heating for said diffusion step.

16. The method of claim 14, wherein said oxidizing step is carried out subsequent to said diffusing step.

17. The method of claim 1, 2, 4 or 7, comprising forming said masking layer before implanting said first conductivity type impurities.

18. The method of claim 1, 2, 4 or 7, comprising forming said masking layer after implanting said first conductivity type impurities.

* * * * *

UNITED STATES PATENT AND TRADEMARK OFFICE
CERTIFICATE OF CORRECTION

PATENT NO. : 4,350,536

DATED : 21 September 1982

INVENTOR(S) : Nakano et al

It is certified that error appears in the above-identified patent and that said Letters Patent is hereby corrected as shown below:

```
Col. 3,  line 64, before "can" insert --,--;
         line 65, after "etching," insert --and--.
Col. 4,  line 20, "tionm" should be --tion--;
         line 67, "mal by" should be --mally--.
Col. 6,  line 23, "type," should be --type;--;
         line 29, "plate," should be --plate;--.
```

Signed and Sealed this

Eighth Day of February 1983

[SEAL]

Attest:

Attesting Officer

GERALD J. MOSSINGHOFF

Commissioner of Patents and Trademarks